United States Patent
Bowers

(10) Patent No.: US 7,339,428 B2
(45) Date of Patent: Mar. 4, 2008

(54) DUAL OP AMP IC WITH SINGLE LOW NOISE OP AMP CONFIGURATION

(75) Inventor: Derek F Bowers, Los Altos Hills, CA (US)

(73) Assignee: Analog Devices, Inc., Norwood, MA (US)

( * ) Notice: Subject to any disclaimer, the term of this patent is extended or adjusted under 35 U.S.C. 154(b) by 131 days.

(21) Appl. No.: 11/415,663

(22) Filed: May 1, 2006

(65) Prior Publication Data

US 2007/0252652 A1 Nov. 1, 2007

(51) Int. Cl.
*H03F 3/45* (2006.01)
(52) U.S. Cl. .................................. 330/252; 330/307
(58) Field of Classification Search ............... 330/252, 330/307
See application file for complete search history.

(56) References Cited

U.S. PATENT DOCUMENTS

| | | | |
|---|---|---|---|
| 5,012,436 A * | 4/1991 | Burri | 702/104 |
| 6,590,448 B1 | 7/2003 | Burt | 330/124 R |
| 6,664,851 B1 | 12/2003 | Pihlstrom et al. | 330/51 |
| 2005/0162230 A1 | 7/2005 | Tran et al. | |
| 2005/0248400 A1 | 11/2005 | Wagner | |

FOREIGN PATENT DOCUMENTS

GB 2305038 A 3/1997

OTHER PUBLICATIONS

PCT International Search Report; Sep. 10, 2007; in International Application No. PCT/US2007/010147; 5 pp.
PCT Written Opinion of the International Searching Authority; Sep. 10, 2007; in International Application No. PCT/US2007/010147; 5 pp.

* cited by examiner

*Primary Examiner*—Steven J. Mottola
(74) *Attorney, Agent, or Firm*—Koppel, Patrick, Heyhl & Dawson

(57) ABSTRACT

A multiple op amp IC with a single low noise op amp configuration comprises at least two op amp circuits fabricated on a common substrate. The IC can be configured such that the multiple op amps are connected in parallel to form a single op amp having output drive and input-referred noise characteristics which are superior to those of the constituent op amps. The IC can be fabricated with either first or second metallization patterns, with the first pattern providing multiple op amps with separate inputs and outputs, and the second pattern interconnecting the amplifiers to form a single op amp. The second pattern also preferably interconnects at least one set of corresponding high impedance nodes to prevent a difference voltage which might otherwise arise between the nodes due to component mismatches between the multiple op amps.

13 Claims, 4 Drawing Sheets

DUAL OP AMP IC WITH SINGLE LOW NOISE OP AMP CONFIGURATION

BACKGROUND OF THE INVENTION

1. Field of the Invention

This invention relates to operational amplifier (op amp) integrated circuits (ICs), and particularly to dual op amp ICs.

2. Description of the Related Art

Op amps are one of the most commonly used electronic building blocks. Each op amp implementation has an associated set of specifications, which impose limitations on the amplifier's usefulness and suitability for various applications; those specifications include, for example, input-referred noise and rated output current. While a particular op amp's noise and output current specifications may be sufficient for some applications, they may be unacceptable for others.

One approach to improving the performance of an op amp requires connecting two amplifiers in parallel to form a single op amp: the inverting inputs of each amplifier are connected together, as are their non-inverting inputs and their outputs. The resulting single amplifier has noise and rated output current specifications which are superior to those of either constituent amplifier acting alone. However, problems can arise if the characteristics of the two amplifiers are not identical. Because of the high gain of the internal stages, small mismatches in the internal transistors can cause one or more pairs of corresponding high impedance nodes to be at different voltages, which can result in large currents flowing between the two connected outputs, as well as a possible loss of gain. When the constituent amplifiers have externally accessible compensation pins, connecting them together tends to reduce these problems. However, this approach still requires the use of two discrete op amps and the attendant wiring required to effect the required parallel connections.

SUMMARY OF THE INVENTION

A multiple op amp IC with a single low noise op amp configuration is presented, which overcomes the problems noted above. A monolithic IC on which at least two op amps are provided can be configured such that the amplifiers are connected in parallel to provide a single op amp with improved noise and output drive capabilities.

One embodiment of the present IC comprises first and second op amp circuits fabricated on a common substrate, each of which have inverting and non-inverting inputs and an output. The IC is adapted to be fabricated with either first or second interconnection means. When fabricated with the first interconnection means, the IC provides two op amps with separate inputs and outputs.

However, when fabricated with the second interconnection means, the IC provides a single op amp, with the two inverting inputs, the two non-inverting inputs, and the two outputs connected together. The first and second op amps have associated input-referred noise characteristics, but when combined as described, the noise characteristic associated with the resulting single op amp is superior to that of the constituent op amps. The output drive capability of the single op amp is also improved with respect to that offered by the first or second op amps acting alone.

The first and second interconnection means are preferably respective metallization patterns, either one of which can be formed on the common substrate to provide a dual or single op amp, respectively.

The first op amp has one or more high impedance nodes, corresponding ones of which are present in the second op amp. The IC is preferably arranged such that, when fabricated with the second interconnection means, at least one pair of corresponding high impedance nodes are connected together so as to prevent a difference voltage which might otherwise arise between the corresponding nodes due to component mismatches between the first and second op amps.

Though a monolithic IC comprising two op amp circuits is described above, the invention may also be advantageously applied to ICs containing more than two op amps. The invention is useful with various op amp types, and may be used with single- or multiple-stage amplifiers.

Further features and advantages of the invention will be apparent to those skilled in the art from the following detailed description, taken together with the accompanying drawings.

DETAILED DESCRIPTION OF THE INVENTION

The present multiple op amp IC comprises at least two op amp circuits fabricated on a common substrate. The IC is adapted to be fabricated with either first or second interconnection means. When fabricated with the first interconnection means, the IC provides multiple op amps with separate inputs and outputs in the manner of a conventional multiple op amp IC. However, when fabricated with the second interconnection means, a single op amp is formed having noise and output drive characteristics which are superior to those of any of the constituent amplifiers.

As noted above, the present IC comprises at least two op amp circuits. However, for simplicity, a dual op amp IC is used for illustration in the following description.

Figure 1A:
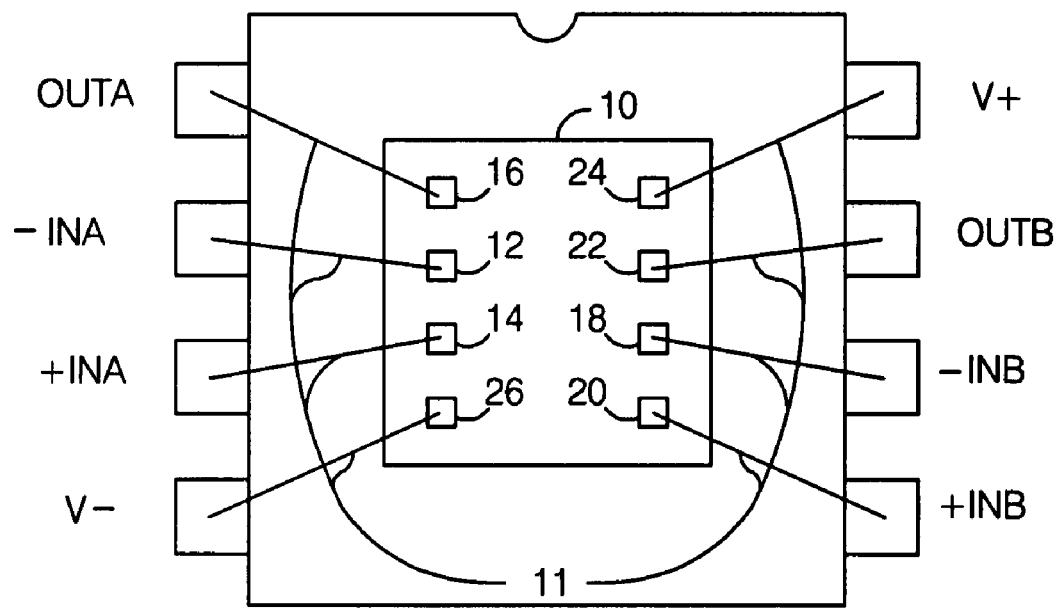
FIGS. 1a and 1b are diagrams illustrating the present dual amp IC in dual amp and single amp configurations, respectively.
Figure 1B:
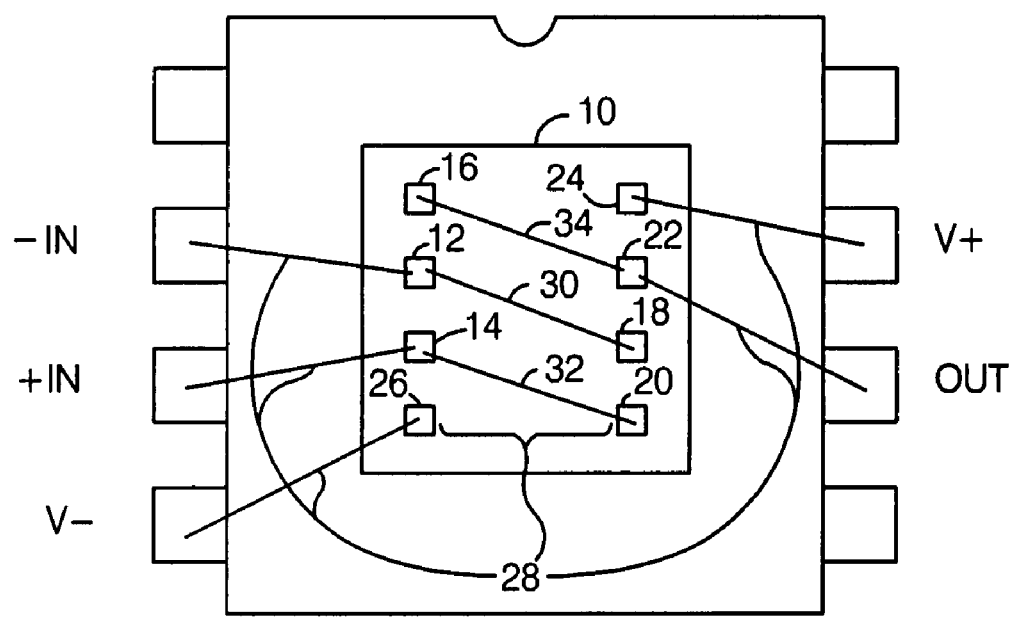

The first and second interconnection means are preferably respective metallization patterns, either of which can be formed on the common substrate to provide a dual or single op amp, respectively. A metallization pattern may be implemented in several different ways, such as with metal traces fabricated on the substrate, or with bond wires. This is illustrated in FIGS. 1a and 1b. The first and second op amp circuits are fabricated on a common substrate 10. FIG. 1a shows the IC with the first interconnection means 11 employed, such that two op amps with separate inputs and outputs are provided: pins 12, 14 and 16 are the inverting, non-inverting and output pins for the first op amp (op amp 'A'), and pins 18, 20 and 22 are the inverting, non-inverting and output pins for the second op amp (op amp 'B'). Pins 24 and 26 provide supply voltages V+ and V− to both op amps.

FIG. 1b shows the use of the second interconnection means 28, needed to provide an IC with a single op amp: here, interconnection means 28 includes a metal interconnect 30 which connects inverting inputs 12 and 18 together, a metal interconnect 32 which connects non-inverting inputs 14 and 20 together, and a metal interconnect 34 connects outputs 16 and 22 together.

Connecting the two op amps in parallel in this way provides several advantages. One advantage is that the input-referred noise for the resulting single op amp is reduced by the $\sqrt{2}$ in comparison with the input-referred noise characteristic associated with either of the first or second op amps. Thus, if the input-referred noise characteristic for the constituent amps individually is $$x \frac{nV}{\sqrt{Hz}},$$

the input-referred noise for the single amp configuration is $$\frac{x}{\sqrt{2}} \frac{nV}{\sqrt{Hz}}.$$

Connecting the two op amps in parallel also functions to improve the output drive—i.e., the amount of current that the output can supply without seriously degrading the open-loop gain, reducing the output swing to unusable levels or damaging the amplifier—of the resulting single op amp in comparison with the output drive characteristic associated with either of the first or second op amps.

Thus, the present invention enables a single chip layout to be used for either a dual op amp or a single, low-noise op amp, by simply providing the appropriate interconnections. For example, the layout could accommodate a first metallization pattern which provides a dual op amp IC, or a second metallization pattern which provides the single low-noise IC. One pattern or the other can be selected by employing the proper mask or masks during the fabrication process.

However, a problem can arise when connecting two op amps in parallel as described above. Gain is obtained in an op amp by feeding the (high impedance) output of a transconductive element (usually a transistor collector or drain) into a high impedance load (current source or large resistor), and then into some sort of buffer (output stage) or input to another transconductive element (subsequent gain stage). Each of these stages has potentially a very high gain; therefore, very small signals attempt to produce very large voltage swings at the high impedance nodes, which is prevented by the overall negative feedback normally employed around the op amp.

This is also true for the parallel connection described above, and indeed if the IC's two op amps are identical, connecting the inputs and outputs together would be sufficient. However, due to the high gain of the internal stages, small mismatches—due, for example, to imperfect fabrication in the internal transistors (particularly the transconductive elements)—causes the high impedance nodes of the two amplifiers to be at different voltages, only the average of which is corrected by negative feedback. This difference in node voltages can be problematic. In the case of the two output buffers, large currents can flow (internally) between the two (connected) outputs, causing excessive supply currents to be drawn. In the case of preceding stages, one of the following transconductive elements can become overdriven and can saturate, causing drastic loss of gain.

Figure 2:
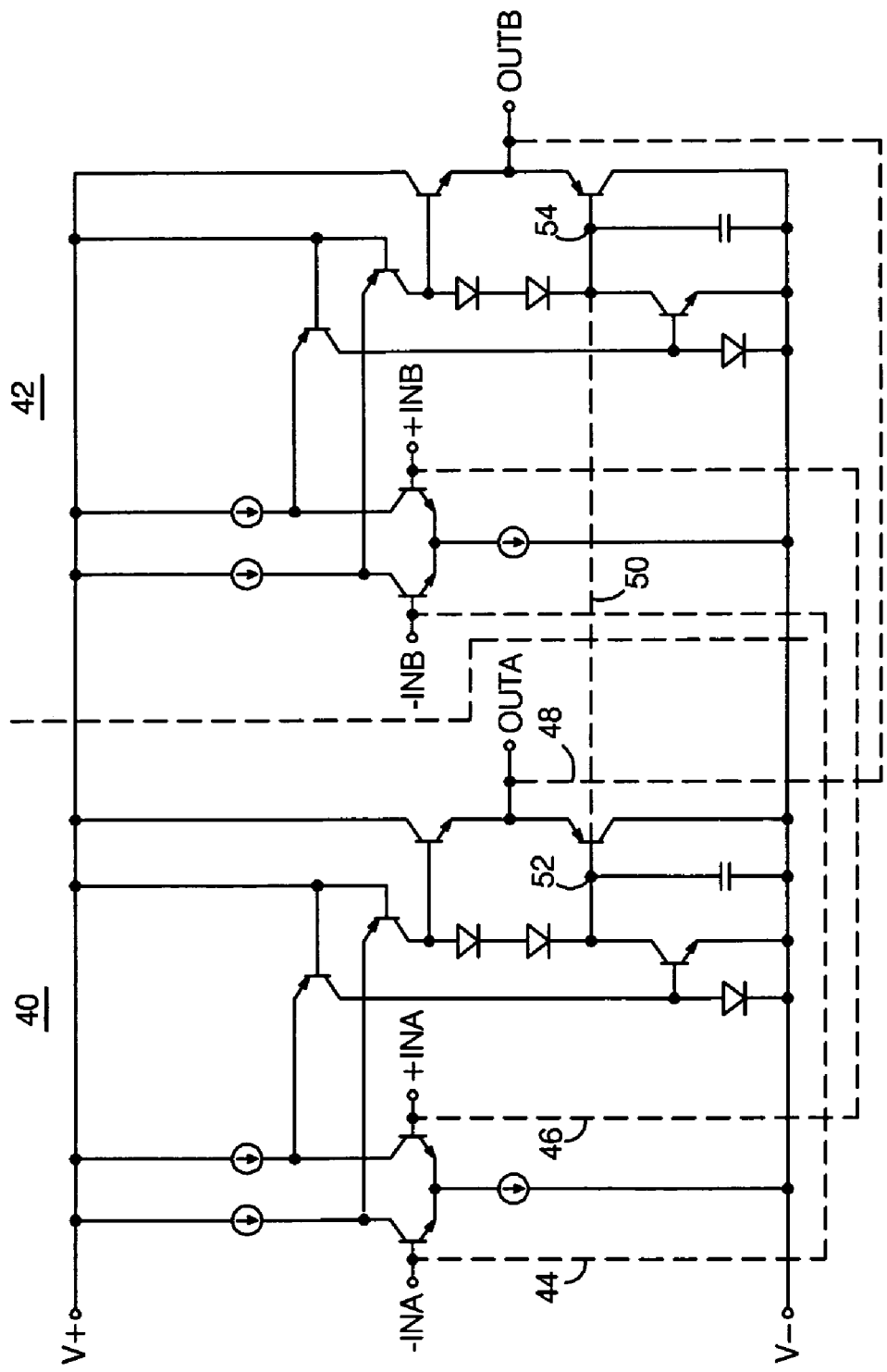
FIG. 2 is a schematic diagram of one possible embodiment of the present IC, which employs two single-stage op amps.

The present invention addresses this problem by preferably connecting together at least one pair of corresponding high impedance nodes, so as to prevent a difference voltage which might otherwise arise between the corresponding nodes due to component mismatches between the first and second op amps. This is illustrated in the schematic of FIG. 2, which shows a first op amp 40 and a second op amp 42, both of which would be fabricated on a common substrate. The implementation shown for each amplifier is that of a typical single-stage op amp; note, however, that the invention is generally applicable to any op amp design.

As noted above, the IC is arranged such that it can be fabricated with either first or second interconnection means to provide either a dual op amp part, or a single op amp. The interconnections indicated by the dashed lines would be present when the IC is configured as a single op amp, but would not be made when configured as a dual op amp.

When configured as a single op amp, an interconnection 44 connects inverting inputs −INA and −INB together, an interconnection 46 connects non-inverting inputs +INA and +INB together, and an interconnection 48 connects outputs OUTA and OUTB together.

In addition, interconnections are preferably provided between at least one pair of corresponding high impedance nodes. For example, in FIG. 2, an interconnection 50 may be provided between the compensation node 52 for the output stage of op amp 40 and the corresponding node 54 of op amp 42. Connecting these high impedance nodes together eliminates the possibility of a difference voltage arising between nodes 52 and 54 due to component mismatches between the first and second op amps, thereby preventing saturation or loss of gain problems that might otherwise occur.

Note that nodes 52 and 54 represent just one possible pair of high impedance nodes that might be connected together to ensure reliable performance from the single op amp when the IC is so configured. Other corresponding high impedance nodes—such as compensation nodes, the inputs to output stages, or the inputs to subsequent gain stages—might also be interconnected to further enhance the stability and reliability of the single op amp. Ideally, every node of the two op amps would be connected together; however, this is not a practical approach. The interconnection of one or more pairs of corresponding high impedance nodes as discussed above is generally sufficient to obtain reliable performance, as well as the benefits described herein. The interconnections required to connect corresponding high impedance nodes are preferably provided with a metallization pattern specifically designed for the single op amp configuration.

Figure 3:
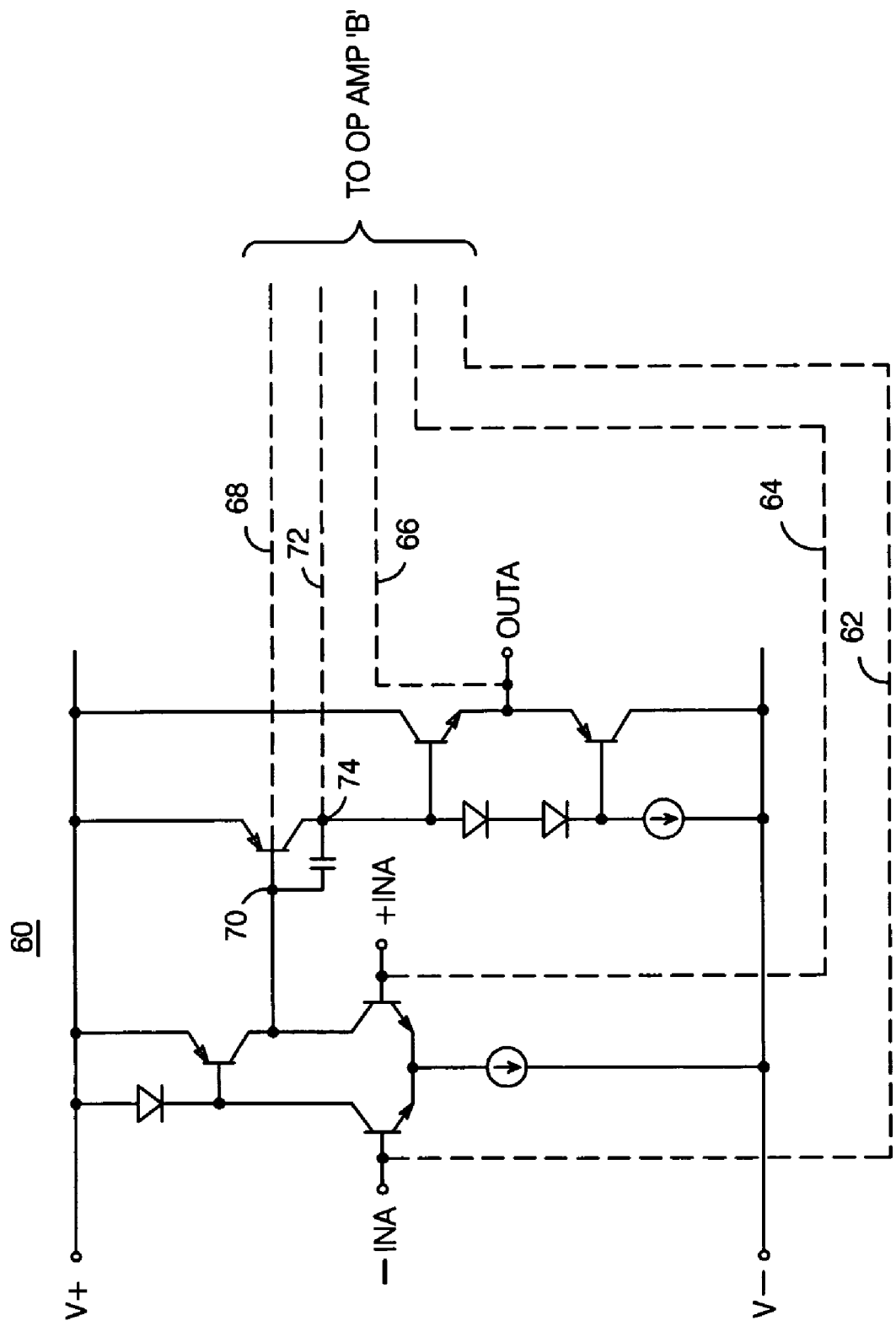
FIG. 3 is a schematic diagram of one possible embodiment of the present IC, which employs two two-stage op amps.

The invention is useful with various op amp types, and may be used with single- or multiple-stage amplifiers. Another possible implementation is shown in FIG. 3, which shows just one op amp 60 of the two that would make up the IC. In this example, the implementation shown is that of a typical two-stage op amp. Again, the interconnections indicated by the dashed lines would be present when the IC is configured as a single op amp, with the connections made to corresponding nodes (not shown) of the second op amp (op amp 'B'). As before, when the IC is configured as a single op amp, an interconnection 62 connects inverting inputs −INA and −INB together, an interconnection 64 connects non-inverting inputs +INA and +INB together, and an interconnection 66 connects outputs OUTA and OUTB together.

In addition, interconnections are preferably provided between at least one pair of corresponding high impedance nodes. For example, in FIG. 3, an interconnection 68 may be provided between the high impedance node 70 at the input to the second stage of op amp 60 and the corresponding node of op amp 'B', and an interconnection 72 may be provided between the high impedance node 74 at the input to the output stage of op amp 60 and the corresponding node of op amp 'B'. Connecting the corresponding high impedance nodes together in this way eliminates the possibility of a difference voltages arising between the nodes that might otherwise result in amplifier instability or failure.

Note that nodes 70 and 74 represent just two of the nodes that might be connected to their counterparts in op amp 'B' to ensure reliable performance from the single op amp when the IC is so configured. More, fewer, or different high impedance nodes might be chosen for interconnection as the demands of a particular application and amplifier implementation require.

Figure 4:
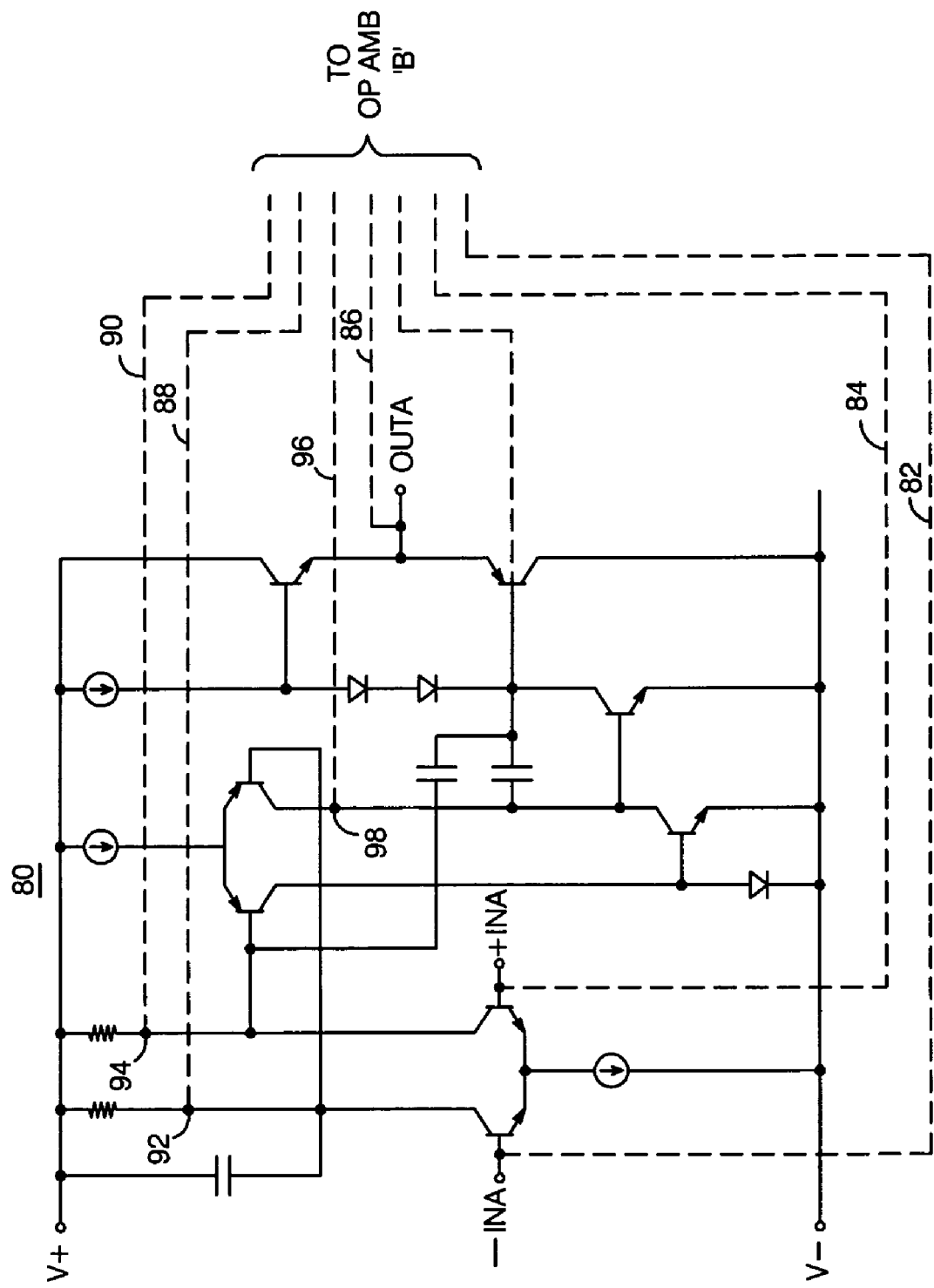
FIG. 4 is a schematic diagram of one possible embodiment of the present IC, which employs two three-stage op amps.

A exemplary embodiment with dual three-stage op amps is shown in FIG. 4, which shows one op amp 80 of the two that would make up the IC. As before, when the IC is configured as a single op amp, an interconnection 82 connects inverting inputs −INA and −INB together, an interconnection 84 connects non-inverting inputs +INA and +INB together, and an interconnection 86 connects outputs OUTA and OUTB together. In addition, interconnections are preferably provided between at least one pair of corresponding high impedance nodes. In FIG. 4, interconnections 88 and 90 may be provided between the high impedance nodes 92 and 94 at the inputs to the second gain stage of op amp 80 and the corresponding nodes of op amp 'B', and an interconnection 96 may be provided between the high impedance node 98 at the input to the output stage of op amp 80 and the corresponding node of op amp 'B'. Connecting these high impedance nodes together eliminates the possibility of difference voltages arising between the nodes that might otherwise result in amplifier instability or failure. As above, more, fewer, or different high impedance nodes might be chosen for interconnection as the demands of a particular application and amplifier implementation require.

As previously noted, the present invention could also be applied to ICs comprising more than two op amp circuits. As with the dual op amp example described above, when such an IC is fabricated with a first interconnection means, the IC provides multiple op amps with separate inputs and outputs. However, when fabricated with a second interconnection means, the multiple amplifiers are connected in parallel to form a single op amp having noise and output drive characteristics which are superior to those of any of the constituent amplifiers. For example, the present invention could be applied to a quad op amp IC; the resulting single op amp having would have half the noise and four times the output drive of any of the constituent amplifiers.

Each of the multiple op amps has one or more corresponding high impedance nodes, and interconnections would preferably be provided between at least one set of corresponding high impedance nodes so as to prevent a difference voltage which might otherwise arise between the corresponding nodes due to component mismatches between the multiple op amps. Note that, though the circuitry shown in FIGS. 2-4 is implemented with bipolar transistors, the invention is equally applicable to FET-based op amps.

While particular embodiments of the invention have been shown and described, numerous variations and alternate embodiments will occur to those skilled in the art. Accordingly, it is intended that the invention be limited only in terms of the appended claims.

I claim:

1. A monolithic multiple op amp integrated circuit (IC), comprising:
    multiple op amp circuits fabricated on a common substrate, each of said op amp circuits having inverting and non-inverting inputs and an output and an associated input-referred noise characteristic;
    said IC adapted to be fabricated with either first or second interconnection means:
        said IC when fabricated with said first interconnection means providing said multiple op amps with separate inputs and outputs, and
        said IC when fabricated with said second interconnection means providing a single op amp with said inverting inputs connected together, said non-inverting inputs connected together, and said outputs connected together, such that the input-referred noise characteristic associated with said single op amp is less than that associated with any of said multiple op amps.

2. The IC of claim 1, wherein each of said multiple op amps has one or more corresponding high impedance nodes, said IC arranged such that, when fabricated with said second interconnection means, at least one set of corresponding high impedance nodes are connected together so as to prevent a difference voltage which might otherwise arise between said corresponding nodes due to component mismatches between the multiple op amps.

3. A monolithic dual op amp integrated circuit (IC), comprising:
    first and second op amp circuits fabricated on a common substrate, each of said op amp circuits having inverting and non-inverting inputs and an output and an associated input-referred noise characteristic;
    said IC adapted to be fabricated with either first or second interconnection means:
        said IC when fabricated with said first interconnection means providing two op amps with separate inputs and outputs, and
        said IC when fabricated with said second interconnection means providing a single op amp with said inverting inputs connected together, said non-inverting inputs connected together, and said outputs connected together, such that the input-referred noise characteristic associated with said single op amp is less than that associated with either of said first and second op amps.

4. The IC of claim 3, wherein said first op amp has one or more high impedance nodes and said second op amp has corresponding high impedance nodes, said IC arranged such that, when fabricated with said second interconnection means, at least one pair of corresponding high impedance nodes are connected together so as to prevent a difference voltage which might otherwise arise between said corresponding nodes due to component mismatches between said first and second op amps.

5. The IC of claim 3, wherein said first and second interconnection means comprise respective metallization patterns.

6. A monolithic dual op amp integrated circuit (IC), comprising:
    first and second op amp circuits fabricated on a common substrate, each of said op amp circuits having inverting and non-inverting inputs and an output and an associated output drive characteristic;

said IC adapted to be fabricated with either first or second interconnection means:
  said IC when fabricated with said first interconnection means providing two op amps with separate inputs and outputs, and
  said IC when fabricated with said second interconnection means providing a single op amp with said inverting inputs connected together, said non-inverting inputs connected together, and said outputs connected together, such that the output drive characteristic associated with said single op amp is improved with respect to that associated with either of said first and second op amps.

7. A monolithic dual op amp integrated circuit (IC), comprising:
  first and second op amp circuits fabricated on a common substrate, each of said op amp circuits having inverting and non-inverting inputs and an output;
  said IC adapted to be fabricated with either first or second interconnection means:
    said IC when fabricated with said first interconnection means providing two op amps with separate inputs and outputs, and
    said IC when fabricated with said second interconnection means providing a single op amp with said inverting inputs connected together, said non-inverting inputs connected together, and said outputs connected together;
  said first op amp having one or more high impedance nodes, corresponding ones of which are present in said second op amp, said IC arranged such that, when fabricated with said second interconnection means, at least one pair of corresponding high impedance nodes are connected together so as to prevent a difference voltage which might otherwise arise between said corresponding nodes due to component mismatches between said first and second op amps.

8. The IC of claim 7, wherein at least one pair of said interconnected high impedance nodes comprise respective compensation nodes.

9. The IC of claim 7, wherein said first and second op amps are single-stage op amps.

10. The IC of claim 7, wherein said first and second op amps are two-stage op amps.

11. The IC of claim 7, wherein said first and second op amps are three-stage op amps.

12. A monolithic dual op amp integrated circuit (IC), comprising:
  first and second op amp circuits fabricated on a common substrate, each of said op amp circuits having inverting and non-inverting inputs and an output and an associated input-referred noise characteristic; and
  a first or second metallization pattern fabricated on said common substrate, said IC when fabricated with said first metallization pattern providing two op amps with separate inputs and outputs, and said IC when fabricated with said second metallization pattern connecting said first and second op amps in parallel to form a single op amp with said inverting inputs connected together, said non-inverting inputs connected together, and said outputs connected together such that the input-referred noise characteristic associated with said single op amp is less than that associated with either of said first and second op amps.

13. The IC of claim 12, wherein said first op amp has one or more high impedance nodes and said second op amp has corresponding high impedance nodes, said second metallization pattern arranged such that at least one pair of corresponding high impedance nodes are connected together so as to prevent a difference voltage which might otherwise arise between said corresponding nodes due to component mismatches between said first and second op amps.

* * * * *